(12) United States Patent
Piron et al.

(10) Patent No.: US 9,612,303 B2
(45) Date of Patent: Apr. 4, 2017

(54) SYSTEM AND METHOD FOR MAGNETIC RESONANCE COIL ARRANGEMENT

(71) Applicants: Cameron Anthony Piron, Toronto (CA); Alexander Gyles Panther, Toronto (CA)

(72) Inventors: Cameron Anthony Piron, Toronto (CA); Alexander Gyles Panther, Toronto (CA)

(73) Assignee: SYNAPTIVE MEDICAL (BARBADOS) INC., Bridgetown (BB)

( * ) Notice: Subject to any disclaimer, the term of this patent is extended or adjusted under 35 U.S.C. 154(b) by 36 days.

(21) Appl. No.: 14/774,435

(22) PCT Filed: Mar. 14, 2014

(86) PCT No.: PCT/CA2014/000246
§ 371 (c)(1),
(2) Date: Sep. 10, 2015

(87) PCT Pub. No.: WO2014/138915
PCT Pub. Date: Sep. 18, 2014

(65) Prior Publication Data
US 2016/0041239 A1    Feb. 11, 2016

Related U.S. Application Data

(60) Provisional application No. 61/799,504, filed on Mar. 15, 2013.

(51) Int. Cl.
*G01V 3/00*   (2006.01)
*G01R 33/34*   (2006.01)
(Continued)

(52) U.S. Cl.
CPC ..... *G01R 33/34046* (2013.01); *G01R 33/341* (2013.01); *G01R 33/34084* (2013.01);
(Continued)

(58) Field of Classification Search
CPC .................................................. G01R 33/34046
(Continued)

(56) References Cited

U.S. PATENT DOCUMENTS 5,548,218 A * 8/1996 Lu ........................... G01R 33/34
324/318
5,592,088 A * 1/1997 Matsunaga ...... G01R 33/34053
324/318

(Continued)

OTHER PUBLICATIONS

International Search Report, Jun. 16, 2014, PCT/CA2014/000246.

*Primary Examiner* — Louis Arana
(74) *Attorney, Agent, or Firm* — Perry + Currier Inc.

(57) ABSTRACT

A magnetic resonance imaging (MRI) system is provided. The system includes a main field magnet generating a main magnetic field B0. Moreover, the system further includes radio frequency (RF) receiver coils including a first combination of two coils, the two coils of the first combination decoupled based on quadrature decoupling such that the two coils of the first combination are able to receive signals orthogonal to each other and to B0. The two coils can be butterfly coils, the loop-plain of the butterfly coils arranged along a surface, the longitudinal axis of the butterfly coils being substantially orthogonal and crossing at substantially midpoint. The surface can be substantially orthogonal to B0 and be curved. The first of the two coils can also be a loop coil and the second of the two coils a butterfly coil.

12 Claims, 9 Drawing Sheets

(51) Int. Cl.
  *G01R 33/565* (2006.01)
  *G01R 33/341* (2006.01)
  *G01R 33/385* (2006.01)
  *G01R 33/48* (2006.01)
  *G01R 33/54* (2006.01)
  *G01R 33/56* (2006.01)

(52) U.S. Cl.
  CPC ....... *G01R 33/385* (2013.01); *G01R 33/4818* (2013.01); *G01R 33/546* (2013.01); *G01R 33/565* (2013.01); *G01R 33/5608* (2013.01)

(58) Field of Classification Search
  USPC .......................... 324/318, 322, 309, 307, 300
  See application file for complete search history.

(56) References Cited

U.S. PATENT DOCUMENTS

| | | | |
|---|---|---|---|
| 6,639,406 B1* | 10/2003 | Boskamp | G01R 33/3415 324/318 |
| 6,954,069 B2 | 10/2005 | Harvey et al. | |
| 7,049,819 B2 | 5/2006 | Chan et al. | |
| 7,348,778 B2 | 3/2008 | Chu et al. | |
| 7,970,452 B2 | 6/2011 | Piron et al. | |
| 2008/0042648 A1* | 2/2008 | King | G01R 33/3415 324/318 |
| 2013/0113485 A1* | 5/2013 | Zhu | G01R 33/365 324/322 |

* cited by examiner

SYSTEM AND METHOD FOR MAGNETIC RESONANCE COIL ARRANGEMENT

RELATED APPLICATIONS

This application claims priority from US patent application 61/799,504, filed Mar. 15, 2013. Priority is claimed to this earlier filed application and the contents of this earlier filed application are incorporated herein, in its entirety, by reference.

FIELD OF THE INVENTION

The present invention relates generally to magnetic resonance imaging. More specifically, the present invention relates to an arrangement of coils for increasing signal detection sensitivity of a magnetic resonance imaging system.

BACKGROUND OF THE INVENTION

Magnetic resonance imaging (MRI) is a major imaging technique used in medicine. MRI is capable of generating detailed images of soft tissues such as the brain, muscles and kidneys. Specific properties of the various compounds found inside tissues, such as water and/or fat, are used to generate images. When subjected to a strong magnetic field, the vector sum of the nuclear magnetic moments of a large number of atoms possessing a nuclear spin angular momentum, such as Hydrogen, which is abundant in water and fat, will produce a net magnetic moment in alignment with the externally applied field. The resultant net magnetic moment will furthermore process with a well-defined frequency that is proportional to the applied magnetic field. After excitation by radio frequency pulses, the net magnetization will generate a signal that can be detected.

Signal to noise ration of receiver coils can be important, especially for low power MRIs. Without sufficiently high signal to noise ratio, scan corruption can results, and image resolution may be reduced.

SUMMARY OF THE INVENTION

It is an object to provide a novel system and method for MRI scanning system and method that obviates and mitigates at least one of the above-identified disadvantages of the prior art.

According to an aspect, a magnetic resonance imaging (MRI) system is provided. The system can comprise a main field magnet generating a main magnetic field B0. Moreover, the system can also comprise radio frequency (RF) receiver coils including a first combination of two coils, the two coils of the first combination decoupled based on quadrature decoupling such that the two coils of the first combination are able to receive signals orthogonal to each other and to B0.

The two coils can be butterfly coils, the loop-plain of the butterfly coils arranged along a surface, the longitudinal axis of the butterfly coils being substantially orthogonal and crossing at substantially midpoint. The surface can be substantially orthogonal to B0 and be curved.

The first of the two coils can also be a loop coil and the second of the two coils a butterfly coil, the loop plain of the coils being arranged along a surface with the loop coil being positioned to have its center align with the center of the butterfly coil. One axis of the surface can be substantially orthogonal to B0. The longitudinal axis of the butterfly loop can be substantially orthogonal to B0. The surface can also be curved.

The RF receiver coils can include a second combination of two coils, the two coils of the second combination being decoupled based on quadrature decoupling such that the two coils of the second combination are able to receive signals orthogonal to each other and to B0. The second combination of two coils can be arranged along a second surface. The first combination of two coils and the second combination of two coils can be decoupled using at least one of: capacitive decoupling, inductive decoupling, geometric decoupling and digital decoupling.

According to another aspect, a receiver cage for use in a magnetic resonance imaging (MRI) system having a main field B0 is provided. The cage can comprise radio frequency (RF) receiver coils including at least one combination of two coils, the two coils of the at least one combination being decoupled based on quadrature decoupling such that the two coils of the at least one combination are able to receive signals orthogonal to each other and to B0.

The cage can also include a substrate for supporting the RF receiver coils. The substrate can be one of flexible or rigid. Where the substrate is rigid, the receiver cage can be in the shape of a head gear having top, front, right, left and back surfaces, each of the at least one combination of two coils being supported by one of the five surfaces. The head gear can be a helmet and the surfaces can be curved in accordance with the topology of the corresponding surfaces of a human head. Where the substrate is flexible, the receiver cage can be in the shape of a slip-on cap.

At least one combination of two coils includes two butterfly coils, the loop-plain of the butterfly coils being arranged along a surface of the receiver cage substantially orthogonal to B0, the longitudinal axis of the butterfly coils being substantially orthogonal and crossing at substantially midpoint. The combination of two coils can include a loop coil and a butterfly coil, the loop plain of the coils being arranged along a surface with the loop coil being positioned to have its center align with the center of the butterfly coil. At least some of the RF receiver coils can be decoupled using at least one of: capacitive decoupling, inductive decoupling, geometric decoupling and digital decoupling.

According to a third aspect, a coil array for use in a magnetic resonance imaging (MRI) system having a main field B0 can be provided. The coil array can comprise radio frequency (RF) receiver coils including at least one combination of two coils, the two coils of the at least one combination decoupled based on quadrature decoupling such that the two coils of the at least one combination are able to receive signals orthogonal to each other and to B0. At least one combination of two coils can include two butterfly coils, the loop-plain of the butterfly coils arranged along a surface of the receiver cage substantially orthogonal to B0, the longitudinal axis of the butterfly coils being substantially orthogonal and crossing at substantially midpoint.

These, together with other aspects and advantages which will be subsequently apparent, reside in the details of construction and operation as more fully hereinafter described and claimed, reference being had to the accompanying drawings forming a part hereof, wherein like numerals refer to like parts throughout.

DETAILED DESCRIPTION

Figure 1:
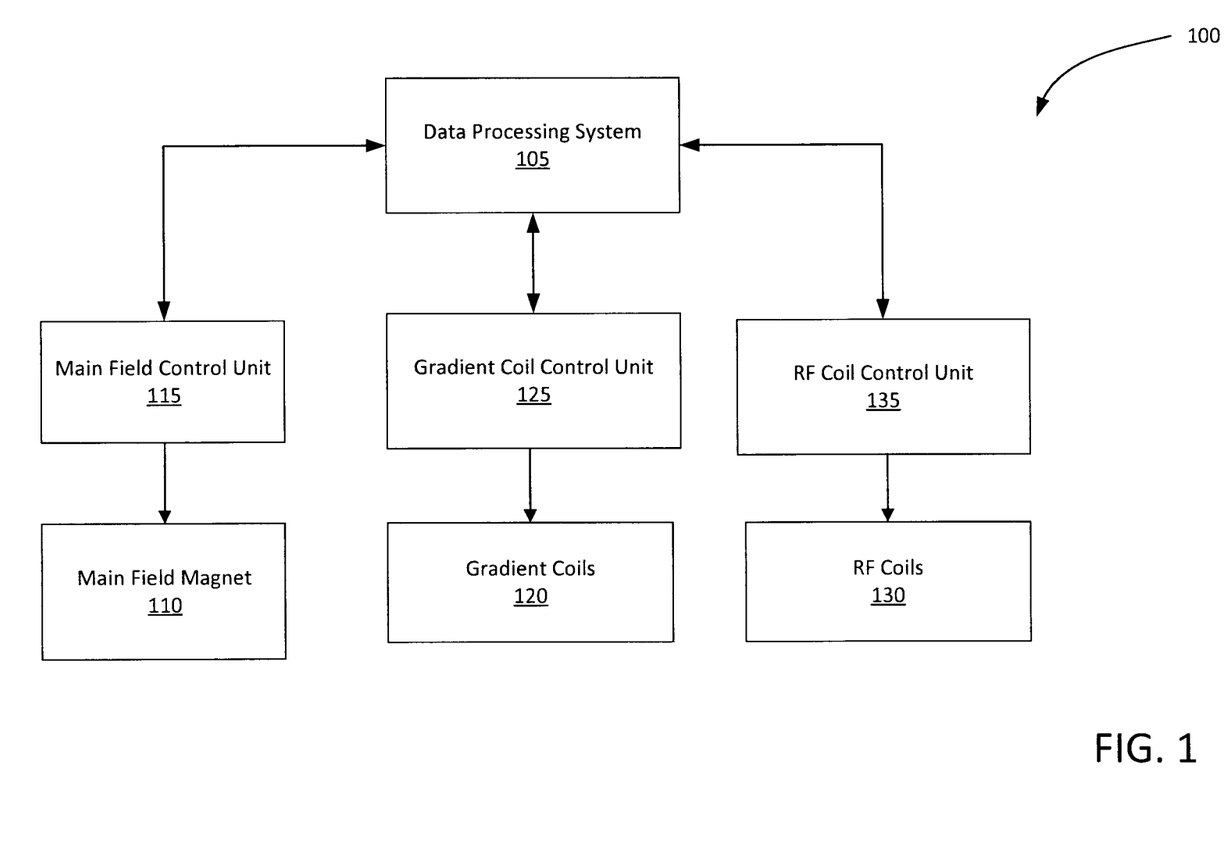
FIG. 1 shows a block diagram of functional subsystems of a magnetic resonance imaging system in accordance with an implementation.

Referring to FIG. 1, a block diagram of a magnetic resonance imaging (MRI) system, in accordance with an exemplary implementation, is shown at 100. The example implementation of MRI system indicated at 100 is for illustrative purposes only, and variations including additional, fewer and/or varied components are possible. MRI is an imaging modality which is primarily used to construct pictures of nuclear magnetic resonance (NMR) signals from hydrogen atoms in an object. In medical MRI, typical signals of interest are NMR signals from water and fat, the major hydrogen containing components of tissues.

As shown in FIG. 1, the MRI system 100 comprises a data processing system 105. The data processing system 105 generally comprises one or more output devices such as a display, one or more input devices such as a keyboard and a mouse as well as one or more processors connected to a memory having volatile and persistent components. The data processing system 105 further comprises an interface adapted for communication and data exchange with the hardware components of MRI system 100 used for performing a scan.

Continuing with FIG. 1, example MRI system 100 also includes a main field magnet 110. The main field magnet 110 can be implemented as a permanent, superconducting or a resistive magnet, for example. Other magnet types, including hybrid magnets suitable for use in MRI system 100 will now occur to a person of skill and are contemplated. Main field magnet 110 is operable to produce a substantially uniform magnetic field B0 having a direction along an axis. The magnetic field B0 is used to create an imaging volume within which desired atomic nuclei, such as the protons in Hydrogen within water and fat, of an object are magnetically aligned in preparation for a scan. In some implementations, as in this example implementation, a main field control unit 115 in communication with data processing system 105 can be used for controlling the operation of main field magnet 110.

MRI system 100 further includes gradient coils 120 used for encoding spatial information in the main magnetic field B0 along, for example, three perpendicular axis. The size and configuration of the gradient coils 120 can be such that they produce a controlled and uniform linear gradient. For example, three paired orthogonal current-carrying gradient coils 120 located within the main field magnet 110 can be designed to produce desired linear gradient magnetic fields. The magnetic fields produced by the gradient coils 120, in combination and/or sequentially, can be superimposed on the main magnetic field B0 such that selective spatial excitation of objects within the imaging volume can occur. In addition to allowing spatial excitation, the gradient coils 120 can attach spatially specific frequency and phase information to the atomic nuclei, allowing the resultant MR signal to be reconstructed into a useful image. A gradient coil control unit 125 in communication with data processing system 100 is used to control the operation of gradient coils 120.

The MRI system 100 further comprises radio frequency (RF) coils 130. The RF coils 130 are used to establish a magnetic field B1 to excite the atomic nuclei or "spins". The RF coils 130 can also detect signals emitted from the "relaxing" spins within the object being imaged. Accordingly, the RF coils 130 can be in the form of separate transmit and receive coils or a combined transmit and receive coil with a switching mechanism for switching between transmit and receive modes.

The RF coils 130 can be implemented as surface coils, which are typically receive only coils and/or volume coils which can be receive and transmit coils. RF coils 130 can be integrated in the main field magnet 110 bore. Alternatively, RF coils 130 can be implemented in closer proximity to the object to be scanned, such as a head, and can take a shape that approximates the shape of the object, such as a close-fitting helmet. An RF coil control unit 135 in communication with data processing system 100 is used to control the operation of the RF coils 130.

To create an image, MRI system 100 detects the presence of atomic nuclei containing spin angular momentum in an object, such as those of hydrogen protons in water or fat found in tissues, by subjecting the object to a large magnetic field. In this example implementation the main magnetic field is denoted as B0 and the atomic nuclei containing spin angular momentum will be Hydrogen protons or simply protons. Magnetic field B0 partially polarizes the Hydrogen protons in the object placed in the imaging volume of the main magnet 110. The protons are then excited with appropriately tuned RF radiation, in this example magnetic field B1. Finally, weak RF radiation signal from the excited protons is detected as they "relax" from the magnetic interaction. The frequency of the detected signal is proportional to the magnetic field to which they are subjected. Cross-section of the object from which to obtain signals can be selected by producing a magnetic field gradient across the object so that magnetic field values of B0 can be varied along various locations in the object. Given that the signal frequency is proportional to the varied magnetic field created, the variations allow assigning a particular signal frequency and phase to a location in the object. Accordingly, sufficient information can be found in the obtained signals to construct a map of the object in terms of proton presence, which is the basis of an MRI image. For example, since proton density varies with the type of tissue, tissue variations can be mapped as image contrast variations after the obtained signals are processed.

To obtain images from the MRI system 100 in the manner described above, one or more sets of RF pulses and gradient waveforms (collectively called "pulse sequences") are selected at the data processing system 105. The data processing system 105 passes the selected pulse sequence information to the RF control unit 135 and the gradient control unit 125, which collectively generate the associated waveforms and timings for providing a sequence of pulses to perform a scan.

Figure 2:
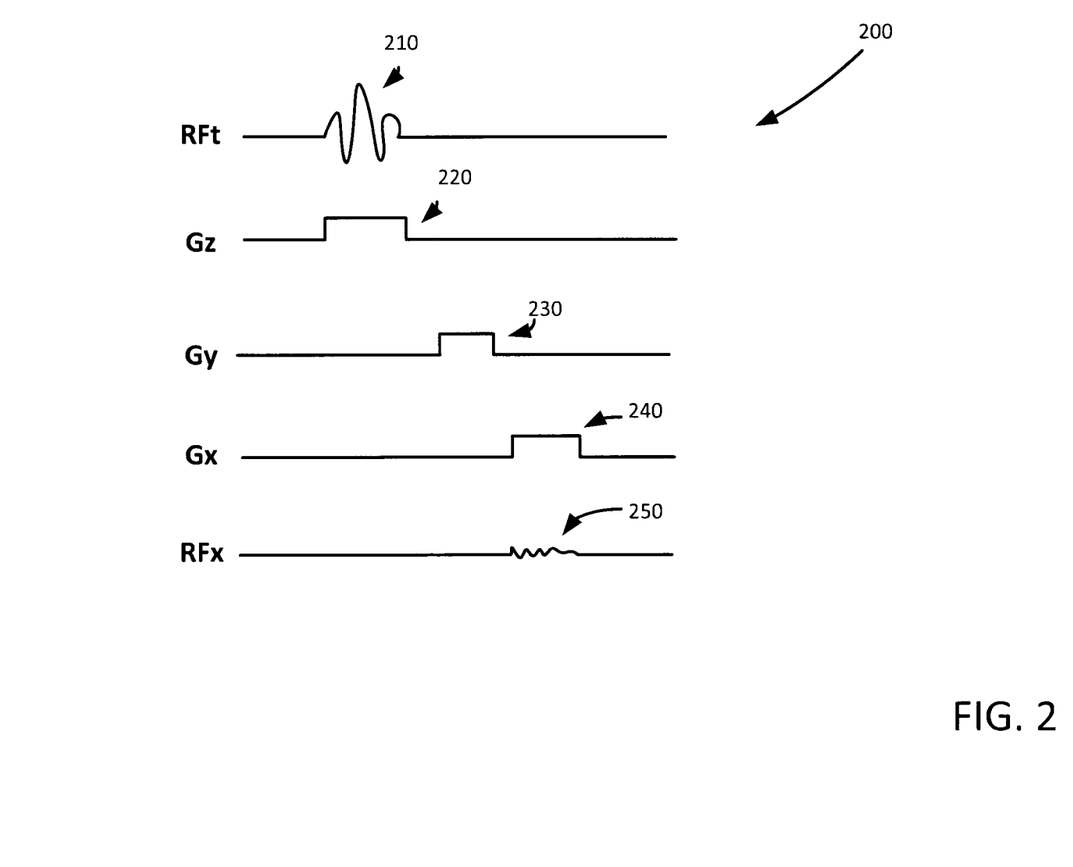
FIG. 2 shows an example pulse sequence in accordance with an implementation.

Referring now to FIG. 2, an illustrative pulse sequence 200 is shown that can be used to acquire images using the MRI system 100. Specifically, a timing diagram for the example pulse sequence is indicated. The timing diagram shows pulse or signal magnitudes, as a function of time, for transmitted RFt signal, magnetic field gradients $G_x$, $G_y$, and $G_z$, and received RFx signal. An idealized pulse sequence, simplified for illustrative purposes, contains a slice selection pulse 210 at RFt, a slice selection gradient pulse 220 at Gz, a phase encoding gradient pulse 230 at Gy, a frequency encoding gradient pulse 240 at Gx, as well as a detected signal 250 at RFx. The pulses for the three gradients Gx, Gy, and Gz represent the magnitude and duration of the magnetic field gradients generated by the gradient coils 120. The slice selection pulse 210 is generated by the transmit aspect of RF coils 130. Detected signal 250 is detected by the receive aspect of the RF coils 130. In this illustrative example it will be assumed that transmit aspect and receive aspect of RF coils 130 are formed by distinct coils.

The first event to occur in pulse sequence 200 is to turn on the slice selection gradient pulse 220. The slice selection pulse 210 is applied at the same time. In this illustrative example, the slice selection pulse 210 is a sinc function shaped burst of RF energy. In other implementations, other RF pulse shapes and durations can be used. Once the slice selection pulse 210 is turned off, the slice selection gradient pulse 220 is also turned off and a phase encoding gradient pulse 230 is turned on. Once the phase encoding gradient pulse 230 is turned off, a frequency encoding gradient pulse 240 is turned on and a detected signal 250 is recorded. It should be noted that the shapes, magnitudes and durations of the pulses and signals shown in FIG. 2 are chosen for illustrative purposes, and that in implementations, one or more of these factors and others may be varied to achieve the desired scan results.

The pulse sequence 200 is repeated a certain number of times, typically 256 times, to collect all the data needed to produce one image. The time between each repetition of the pulse sequence 200 is referred to as the repetition time (TR). Moreover, the duration between the center point of the slice selection pulse 210 and the peak of detected signal 250 is referred to as echo time (TE). Both TR and TE can be varied as appropriate for a desired scan. In some implementations, each time pulse sequence 200 is repeated, the magnitude of the phase encoding gradient pulse 230 is changed. For example, the magnitude can be changed in equal steps between a maximum amplitude and a minimum amplitude of the phase encoding gradient Gy. The variations in amplitude produce a variation in the phase of the processing nuclei across the object being scanned, providing sufficient information for localization of detected signals 250 received for each repetition of pulse sequence 200. For example, pulse sequence 200 can be repeated 256 times with 256 equal magnitude steps of phase encoding gradient pulse 230 to obtain 256 distinct phase offsets containing spatial information in the direction of the phase encoding gradient field. If during the receive period of the pulse sequence, the detected signal 250 is sampled at 256 time points, an image containing 256×256 voxels within the selected slice can be produced after processing. The slice selection gradient pulse 220 can then be varied to acquire an image for a different slice. This process can continue until the desired number of slices are imaged.

Figure 3:
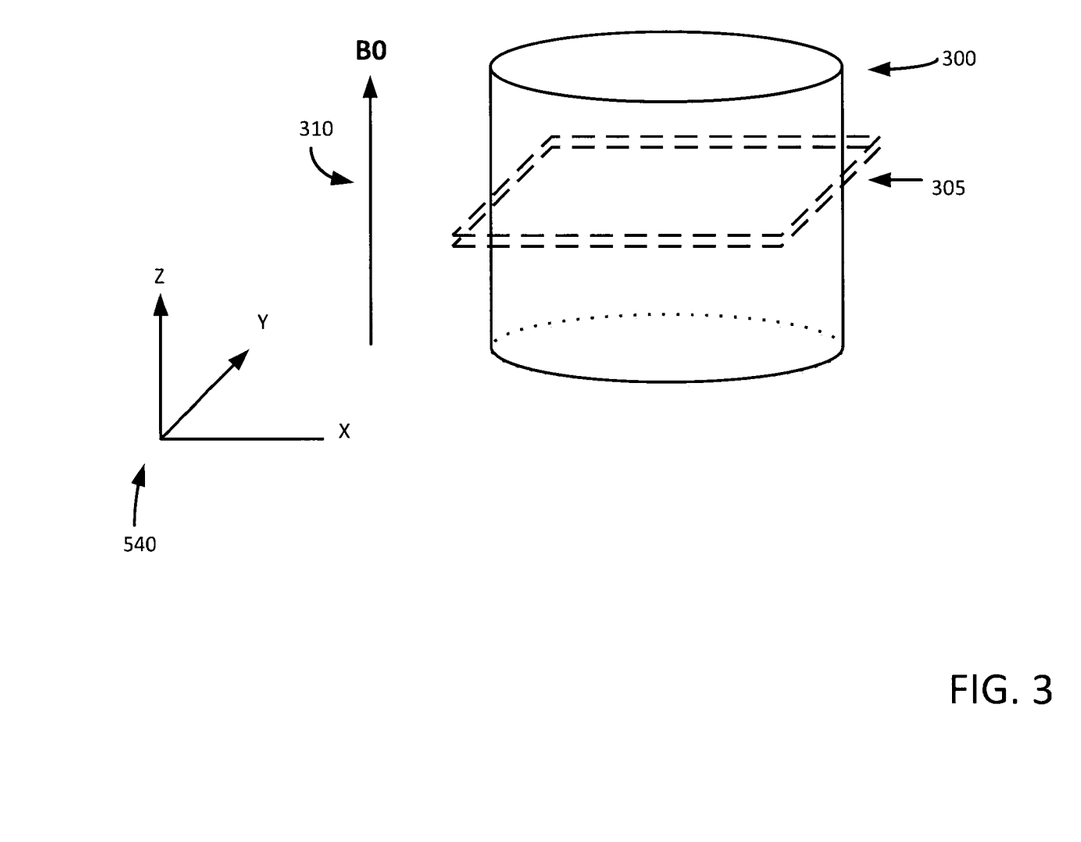
FIG. 3 shows an object and corresponding slice to be scanned by the magnetic resonance system of FIG. 1 in accordance with an implementation.

To further illustrate the signal acquisition process at MRI system 100, it will be assumed that the object being imaged is a cylindrical object as indicated in FIG. 3 at 300. The object 300 has been placed within an external magnetic field B0 at 310, pointing along the Z-axis, and the object subsequently has a net magnetization vector. In this illustrative example, a slice in a plane along the X and Y axes as indicated at 305 is being imaged. It should be noted that in this example, the slice has a finite thickness along the Z-axis, creating a volumetric slice 305. To select a slice, the slice selection gradient pulse 220 is applied along the Z-axis, satisfying the resonance condition for the protons located in the slice 305. Indeed, the location of the slice along the Z-axis is determined based in part on the slice selective gradient pulse 220. Accordingly, the slice selection pulse 210, generated at the same time as the slice selection gradient pulse 220 excites protons that are located within the slice 305 in this example. Protons located above and below the slice 305 are not affected by the slice selection pulse 210.

Continuing with the illustrative example, in accordance with the pulse sequence 200, a phase encoding gradient pulse 230 is applied after the slice selection gradient pulse 220. Assuming this is applied along the Y-axis, the spins at different locations along the Y-axis begin to process at different Larmor frequencies. When the phase encoding gradient pulse 220 is turned off, the net magnetization vectors at different locations process at the same rate, but possess different phases. The phases are determined by the duration and magnitude of the phase encoding gradient pulse 230.

Once the phase encoding gradient pulse 230 is turned off, a frequency encoding gradient pulse 240 is turned on. In this example the frequency encoding gradient is in the X direction. The frequency encoding gradient causes protons in the selected slice to process at rates dependent on their X location. Accordingly, different spatial locations within the slice are now characterized by unique phase angles and processional frequencies. RF receive coils 130 are used to receive the detected signal 350 generated by the protons contained in the object being scanned while the frequency encoding gradient pulse 230 is turned on.

Figure 4:
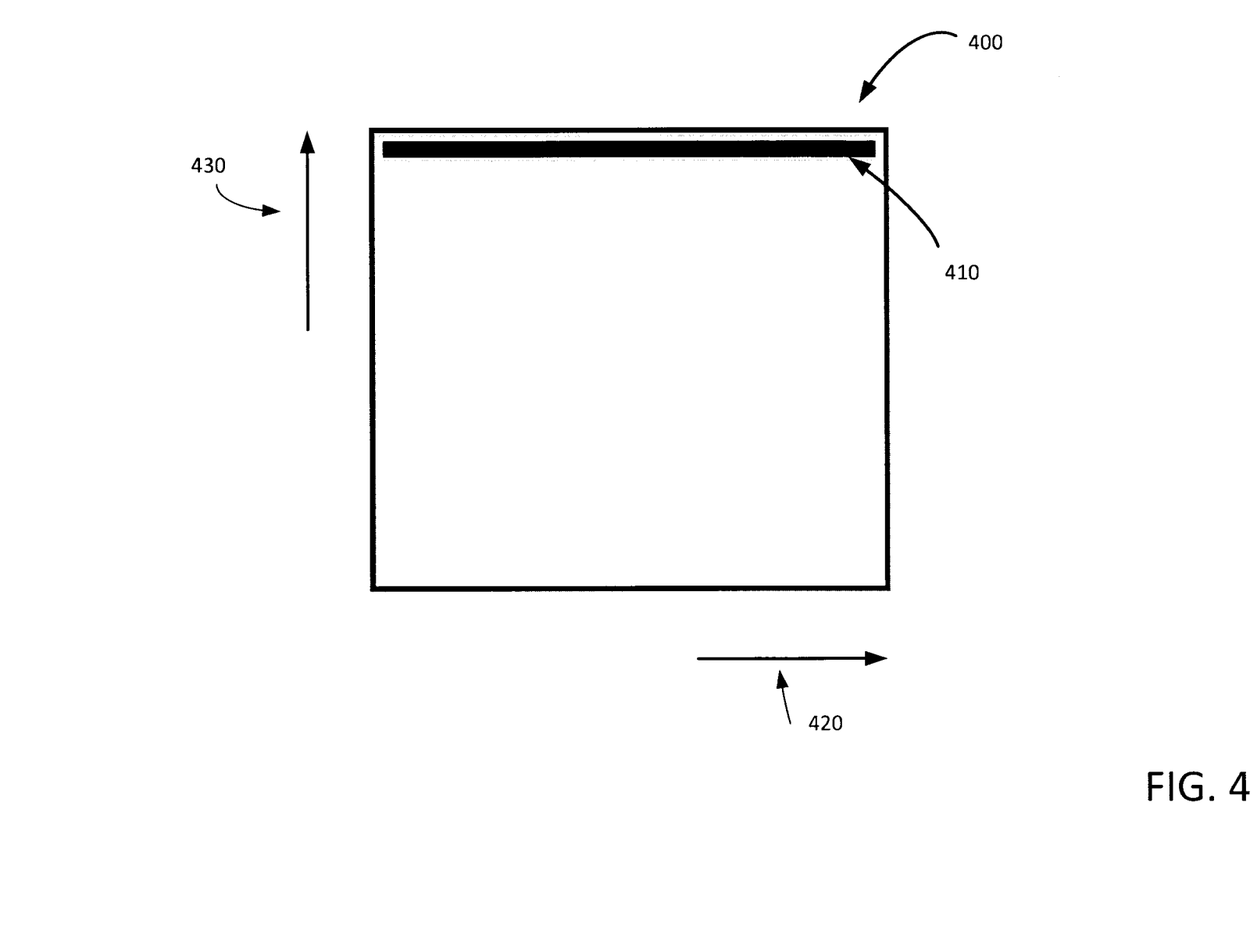
FIG. 4 shows a schematic representation of a k-space containing one received line in accordance with an implementation.

As the pulse sequence 200 is performed by MRI system 100, the acquired signals are stored in a temporary image space matrix referred to as k-space, as shown in FIG. 4 at 400. K-space is the collection of the detected signals measured for a scan and is in the spatial frequency domain. K-space is covered by frequency encoding data along the X-axis 420 (Kx) and phase encoding data along the Y-axis 430 (Ky). When all the lines for the k-space matrix for a slice are received (at the end of the scan of a single slice, for example) the data can be mathematically processed, for example through a two-dimensional Fourier-transform, to produce a final image. Thus, k-space holds raw data before reconstruction of the image into the spatial domain. Typically, k-space has the same number of rows and columns as the final image and is filled with raw data during the scan, usually one line per pulse sequence 200. For example, the first line of k-space 400, indicated at 410 is filled after the completion of the first pulse sequence generated for scanning a slice and contains the detected signal for that pulse sequence. It should be noted that other methods of filling k-space are possible, such as in a spiral manner, and are contemplated.

Coil design can affect the effectiveness of the RF receive coils 130 in receiving the detected signal 250. For scanning brains, for example, one arrangement of coils that can be used is an array of surface coils. Surface coils are receive only coils and have a good signal-to-noise ratio for tissues adjacent to the coil. In general, however, the sensitivity of surface coils drops off as the distance from the coil increases. These factors can affect coil designs. For example, as surface coil signal to noise ratio (SNR) improves the closer the coil is to the tissue of interest, a coil array for performing brain scans may be designed to be as small as possible while fitting the greatest number of head sizes. Accordingly, in one implementation, coil arrays designed to scan the brain, namely head coils, may take the form of a close-fitting object that can be worn on the head, such as a helmet or a slip on cap.

Figure 5:
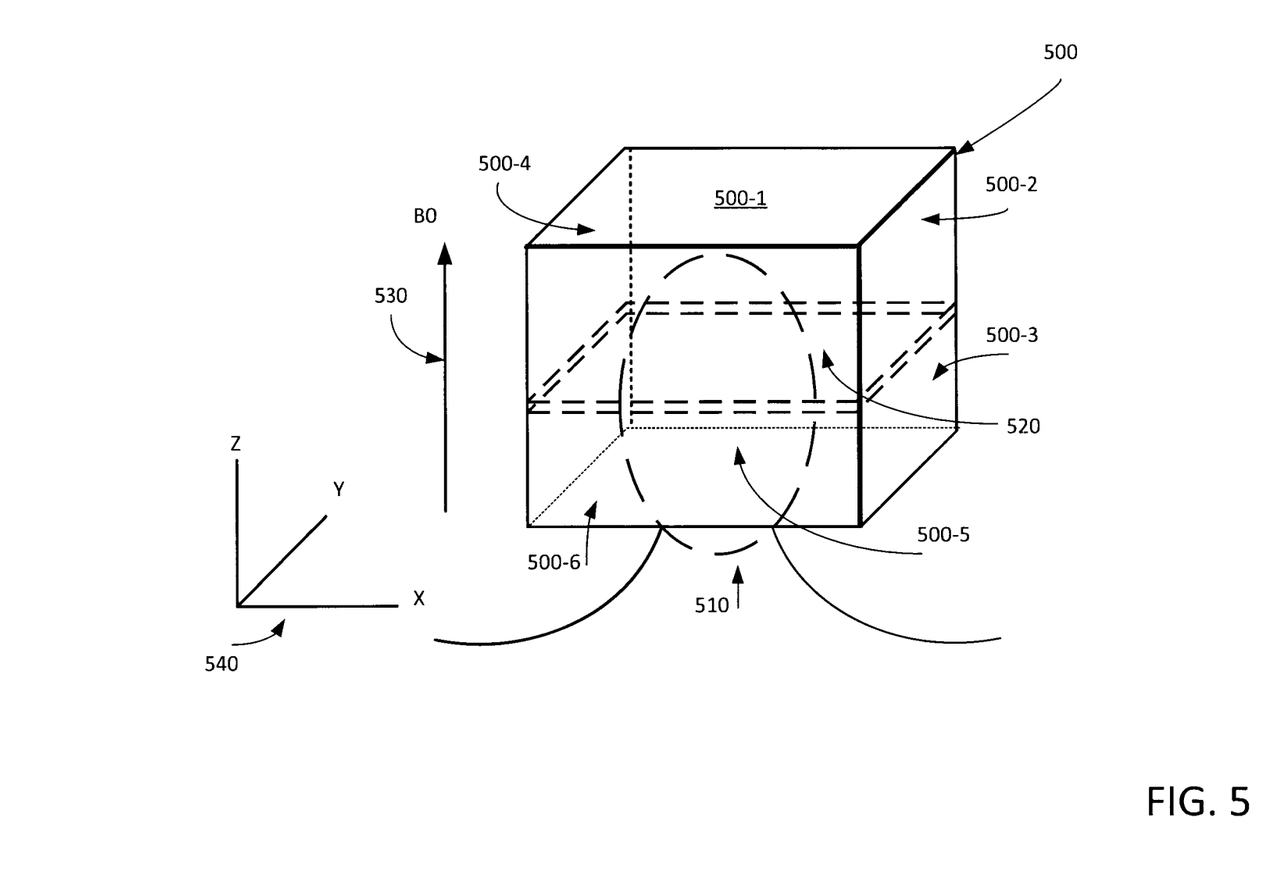
FIG. 5 shows a block diagram of a coli array in accordance with an implementation.

The orientation of the coils in the array can also be important. Referring to FIG. 5, an idealized cube of coil arrays is shown at 500 as an example. It is assumed that the cube can be arranged in a manner such that it can receive an object such as a head to enable scanning, for example the brain. As shown, the array 500 is arranged along a total of 5 surfaces 500-1 through 500-5, substantially orthogonal to each other. Surface 500-6, the bottom surface is typically left open so as to allow the object to be scanned, in this example a person's head 510, to be placed within the enclosure 520 defined by the coil array 500. Surface 500-1 is the top surface aligned with the top of the head 510. Surface 500-2 is the back surface aligned with the back of the head 510. Surfaces 501-3 and 504-4 are right and left surfaces, aligned with the right and left sides of the head 510 respectively. Surface 500-5 is the front surface aligned with the front of head 510 (i.e. the face and forehead). It should be noted that in other variations, coil array 500 may be arranged along fewer or more surfaces than 5 surfaces. For example, in one implementation, coil array 500 may be arranged along surface 500-1 through 500-4 only. Other variations will now occur to a person of skill and are contemplated. For example, in some variations, coil array 500 may be arranged on only a portion of one or more surfaces. For example, in this example, coil array 500 may only be arranged along a part of the front surface 500-5, so as to only align with head 510's forehead and eyes, providing no coverage for the rest of the face. Such an arrangement would be suitable for scanning a brain.

During the operation of the MRI system 100, coil array 500, including head 510 within its enclosure 520, is placed within the imaging volume created by the main filed magnet 110. The main magnetic field B0 created by the main field magnet 110 is indicated at 530, and has a direction along the Z axis, as indicated at 540. Since a coil's effectiveness as a receiver typically relies on receiving a magnetic field orthogonal to B0, it would be desirable for each of the surfaces of coil array 500 to include coils that are sensitive to magnetic fields having a direction along both X-axis and Y-axis indicated at 540.

Figure 6:
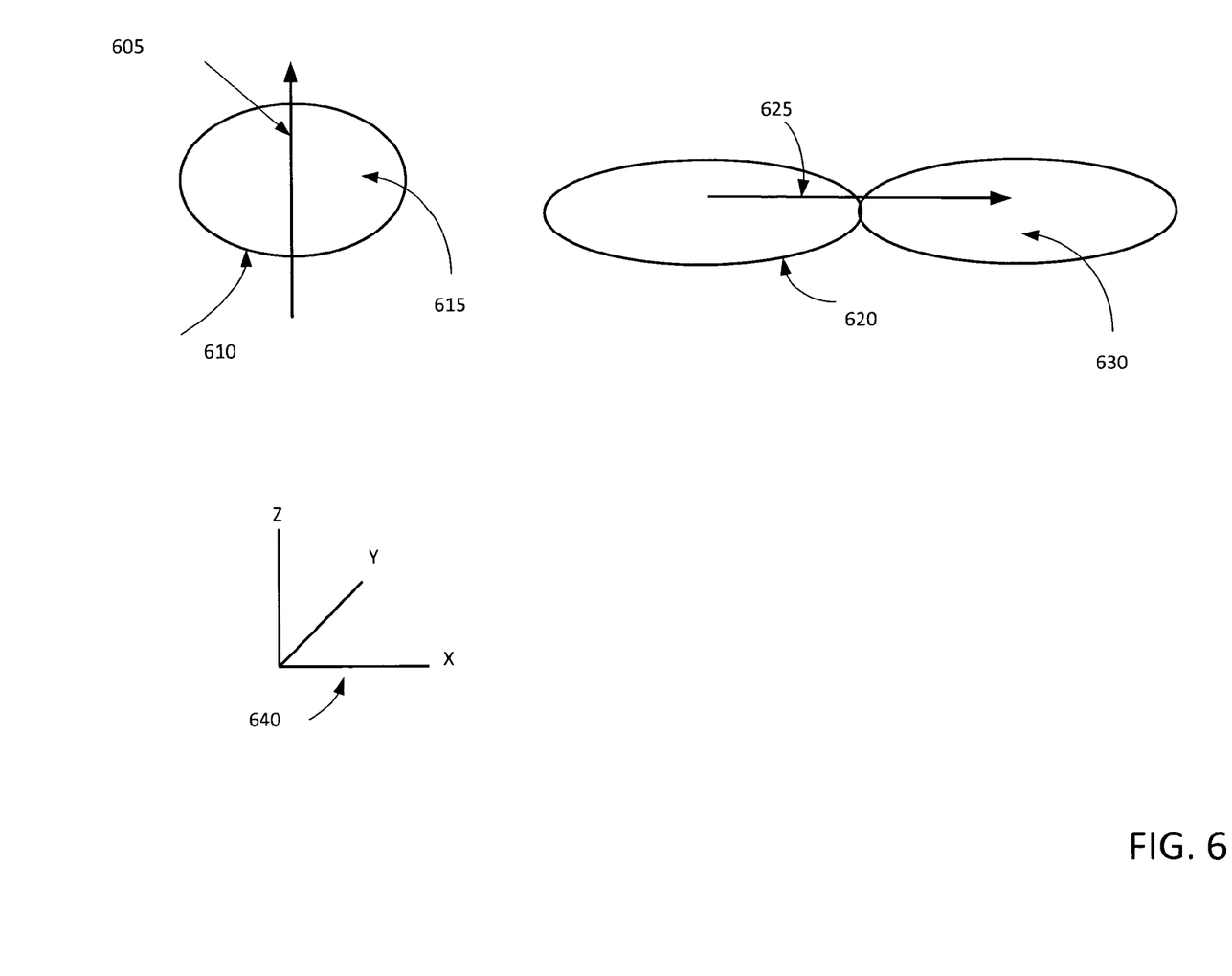
FIG. 6 shows idealized diagram of coils in accordance with an implementation.

Different surface coils are sensitive to different magnetic field directions. Referring now to FIG. 6, two example coils with different magnetic field direction sensitivities are shown. A loop coil 610 is typically sensitive to magnetic fields that are orthogonal to the surface of the coil 610's loop plain 615. The direction of sensitivity is indicated at 605, which in this example is along the Z-axis shown at 640. As the magnetic field direction changes from the perpendicular to the coil's loop-plane 615, the sensitivity of the loop coil 610 decreases resulting in lower signal to noise ratios (SNR) for the detected signals.

A butterfly coil 620, on the other hand, is sensitive to magnetic fields having a direction along the long axis of the coil's loop-plain 630. The direction of sensitivity is indicated at 625, which in this example is along the X-axis shown at 640. As the magnetic field direction varies from the longitudinal axis of the coil, the sensitivity of the butterfly coil 620 decreases resulting in lower signal to noise ratios (SNR) for the detected signals. It should be recognized that the coils shown in FIG. 6, and also in the figures that follow are idealized depictions. In implementations, the shapes and connectivity of the coils can and do vary. Such implementations are contemplated.

Figure 7:
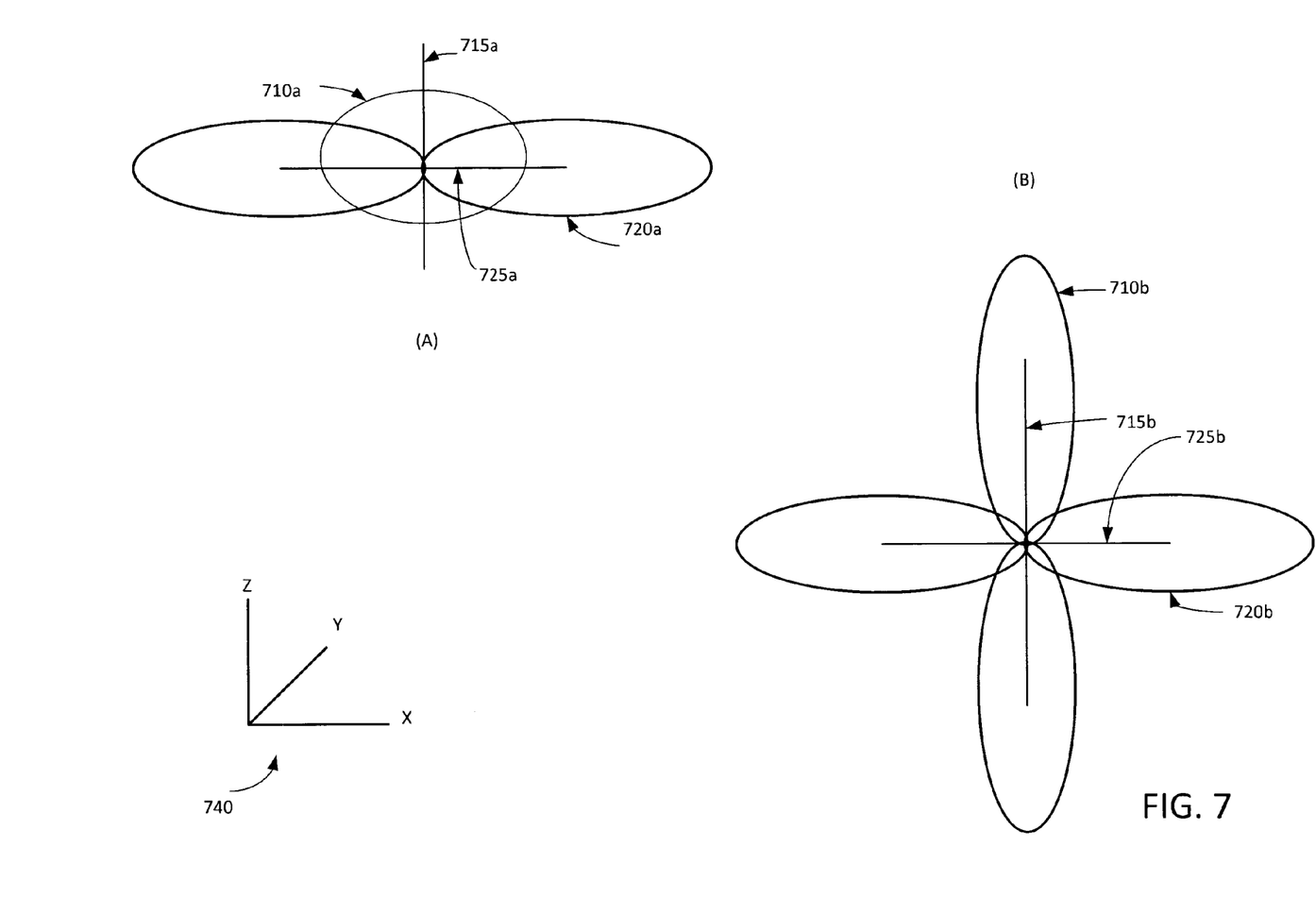
FIG. 7 shows idealized coil combinations in accordance with an implementation.

Quadrature decoupling can enable forming coil combinations as part of coil array 500. The coil combinations can receive two signals that are orthogonal to each other and out of phase. For example, two coils with magnetic field sensitivities in orthogonal directions can be overlapped to provide reception sensitivity for two orthogonal signals at the same location. For example, referring now to FIG. 7(a), a loop coil 710a and a butterfly coil 720a can be overlapped as indicated so as to provide reception sensitivities in the two orthogonal directions indicated at 715a (along Z-axis as indicated at 740) and 725a (along X-axis as indicated at 740). In this example, the loop coil 710 is arranged to have its center be aligned with the center point of the butterfly coil 720. In variations, this arrangement can vary. FIG. 7(b) provides another example where a first butterfly coil 710b and a second butterfly coil 720b can be overlapped so as to provide reception sensitivities in the two orthogonal directions indicated at 715b (along Z-axis) and 725b (along X-axis). In this example, the longitudinal axis of the butterfly coils 710 and 720 are arranged to be substantially orthogonal and crossing at approximately midpoint. In variations, this arrangement can vary.

Since the directional sensitivities of the overlapped coil combinations are substantially orthogonal, the coil included in the combinations typically experience minimal interference (quadrature decoupling). It should be noted that the manner in which the coils are indicated to be overlapping is for illustrative purposes only, and that in implementations, the precise overlap parameters, such as coil size, coil location, center points of coils, portions of overlap and others can vary. Moreover, although in the examples shown, loop and butterfly coils are depicted, in other implementations other coil combinations which can yield similarly orthogonal signal sensitivities can be used and are contemplated.

Figure 8:
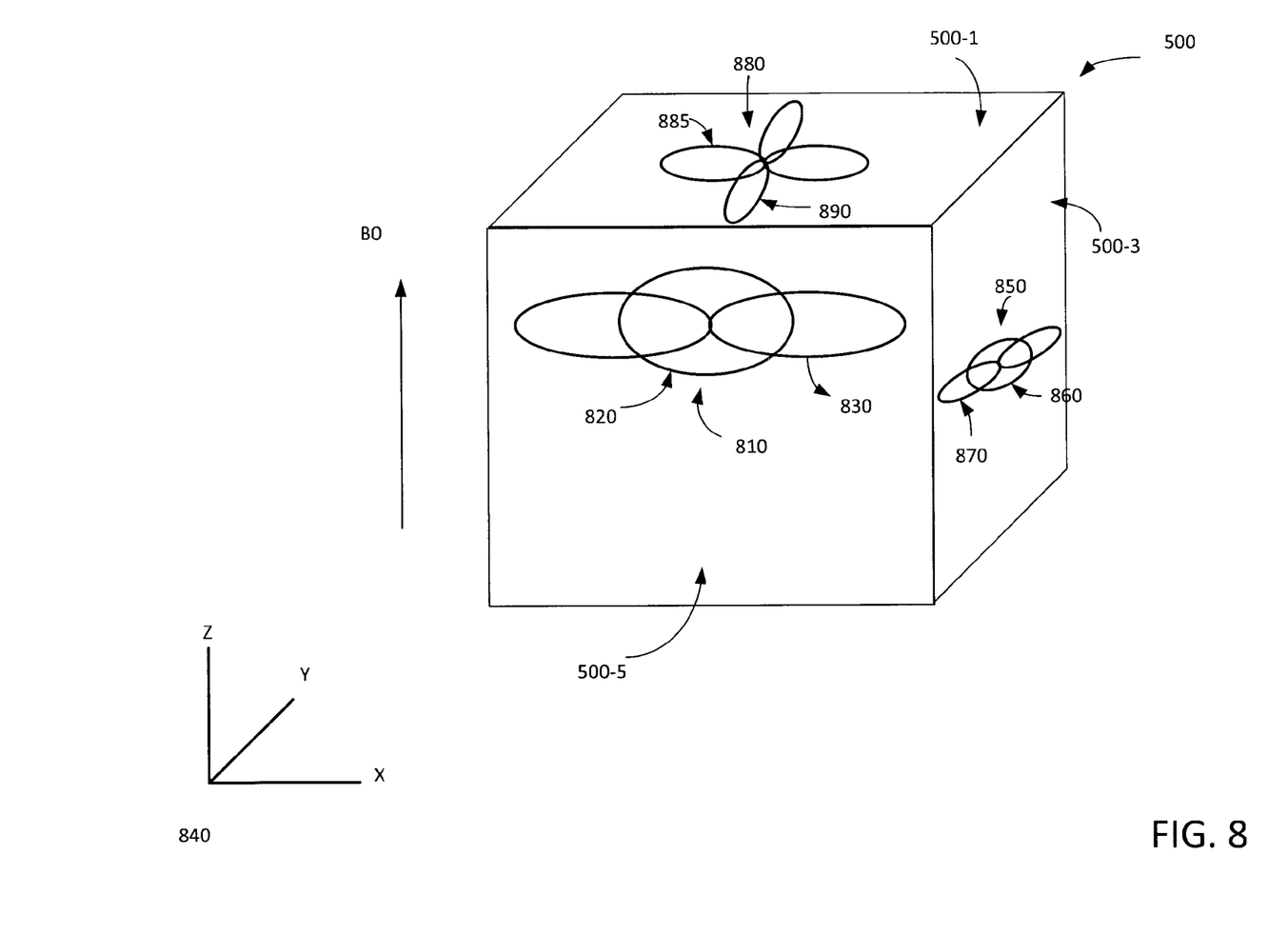
FIG. 8 shows a coil array including coil combinations in accordance with an implementation.

One or more surfaces of the coil array 500 can be populated with coil combinations, as indicated for example in FIG. 8, to achieve reception sensitivities in two directions orthogonal to each other and to B0. Referring now to FIG. 8, front surface 500-5 of coil array 500 is shown arranged with a coil combination 810, including two overlapping coils 820 and 830, achieving signal reception sensitivities along X-axis and Y-axis, the axis for the figure shown at 840. Specifically, loop coil 820 has reception sensitivity along the Y-axis and butterfly coil 830 has reception sensitivity along the X axis. FIG. 8 also shows coil combination 850 including overlapping coils 860 and 870 arranged along right surface 500-3. Specifically, loop coil 860 has reception sensitivity along the X-axis and butterfly coil 870 has reception sensitivity along the Y-axis. Finally, FIG. 8 shows two overlapping loop coils coil combination 880 including overlapping coils 885 and 890 arranged along top surface 500-1. Specifically, butterfly coil 885 has reception sensitivity along the X-axis and butterfly coil 890 has reception sensitivity along the Y-axis. In all cases, the receptive sensitivity of the coils are orthogonal to the main magnet field B0.

It is to be understood that size and location of the coils with respect to the surfaces is chosen for illustrative purposes only, and that in other implementations, the coils can have varying sizes and locations in comparison to the surface dimensions of the coil array 500. For example, coil sizes may be chosen in accordance with the desired depth of detection and may vary based on particular object types. In the case of the brain, the coil sizes may be chosen in accordance with the radius of an average head, for example. In other variations, coil sizes may be customized for individual objects.

The coil locations may be chosen to coincide with the predicted locations of the objects to be placed within the coil array 500. As mentioned above, coil combination 810 may be placed on surface 500-5 to align with a forehead. Although only three coil combinations are shown, it is to be understood that coil array 500 can include other (or fewer) coils and coil combinations. These and other variations are contemplated. For example, even though the coil array surfaces indicated form a cube, in variations, coil array 500 may have more or fewer surfaces as mentioned above. In further variations, each of the surfaces may be curved so as to more closely follow the topology of the object being scanned, such as a head that is to be placed within the coil array. In yet other variations, each surface may not be precisely orthogonal and can vary from the orthogonal. This variation can be even greater where curved surfaces meet.

In other variations, surfaces of coil array 500 can also be supported by a substrate, the substrate being formed out of materials such as plastics that do not cause any interference with the magnetic fields and RF signals involved in the scanning process. The substrate may form a receiver cage that can be used to place the coil array 500 within close proximity of the object to be scanned, for example a head. The substrate used may be rigid, allowing formation of a receiver cage such as a helmet, or flexible, allowing formation of flexible receiver cages such as a slip-on cap. Flexible substrates would allow a closer fit to be formed with the topology of the object being scanned. Other shapes for a coil array and/or substrate combinations will now occur to a person of skill and are contemplated. For example, in one arrangement, the 5 sides of the coil array 500 can be mapped to five sides of a head gear such as a helmet. A receiver cage in the shape of a helmet (or similar head gear) including a coil array would be advantageous for performing brain scans. Accordingly, right surface 500-3 of the coil array 500 would be mapped to the right side of the helmet, left surface 500-4 of the coil array 500 would be mapped to the left side of the helmet, back surface 500-2 of the coil array 500 would be mapped to the back side of the helmet, top surface 500-1 of the coil array 500 would be mapped to the top side of the helmet and front surface 500-5 of the coil array 500 would be mapped to the front side of the helmet. It should be noted that the coil array surfaces would be curved and sized to accommodate the topology of a particular helmet. In variations, only some sides of the helmet may be used to support a coil array.

In some variations, the coil array 500 may stay fixed in the imaging volume of the main field magnet 110 and the object may be placed in and removed from the array in order to perform scans. In other variations the coil array 500 may be placed on the object, such as a helmet on a head, and the object/array combination placed within the imaging volume of the main filed magnet 110 to perform a scan. Other variations will now occur to a person of skill and are contemplated.

Figure 9:
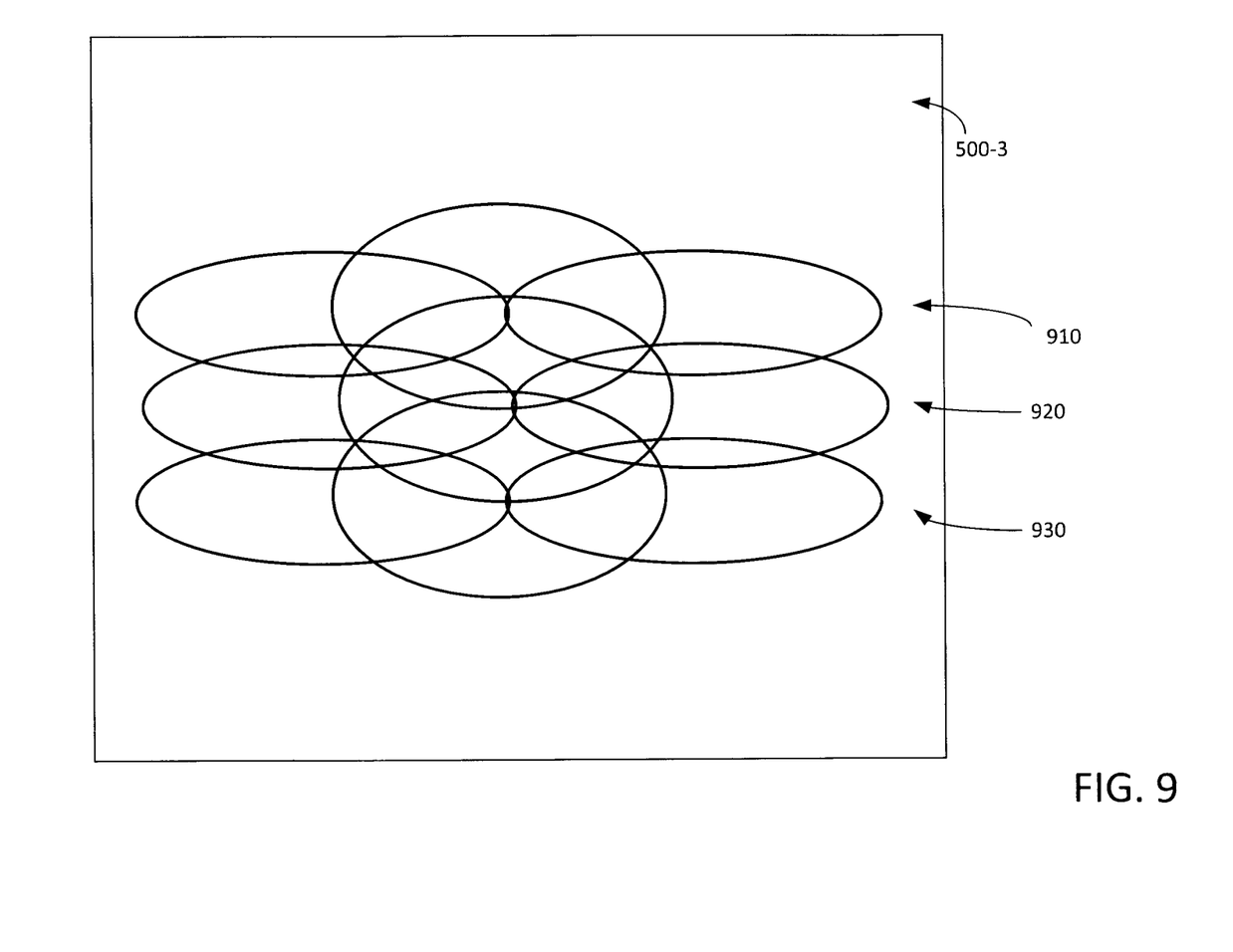
FIG. 9 shows overlapping coil combinations in accordance with an implementation.

Referring now to FIG. 9, multiple coil combinations may be placed on a single surface. As shown in FIG. 9, in some implementations, the multiple coil combinations may overlap. FIG. 9 shows right surface 500-3 of the coil array 500 with three overlapping coil combinations 910, 920 and 930, each coil combination composed of a loop and a butterfly coil. Using multiple coil combinations on a surface, as opposed to the one shown in FIG. 8, can improve the reception signal to noise ratio. The number of coil combinations used, their types, sizes and placement shown are for illustrative purposes only and in other implementations can vary. For example, coil combination locations may be based at least in part on placements that would help minimize decoupling between the coil combinations. Moreover, even though the illustrated coil types used in each combination is the same (a loop and a butterfly) the coil types used in each combination may vary as long as each combination can result in quadrature decoupling.

In some implementations, coils and coil combinations placed on each coil array surface and/or coils and coil combinations between surfaces may be decoupled from each other. In isolation, each coil is receptive to signals at certain frequency ranges. When two or more coils are brought sufficiently close, interference in the form of coupling results, reducing reception sensitivity of the coils at the desired frequencies. If two coils are close enough to overlap, shared capacitors can be used to decouple the coils. If, two coils are close enough to couple but not close enough to overlap, inductors can be used to decouple the coils. These and other decoupling mechanism that will now occur to a person in the skill may be used between one or more coils in the coil array. For example, size, and placement of coils (coil geometry) can play a significant role in decoupling. As an additional example, digital methods of decoupling based on signal processing techniques can also be used. Moreover, the decoupling mechanisms can be combined as appropriate.

The above-described embodiments are intended to be examples and alterations and modifications may be effected thereto, by those of skill in the art, without departing from the scope which is defined solely by the claims appended hereto. For example, methods, systems and embodiments discussed can be varied and combined, in full or in part.

We claim:

1. A magnetic resonance imaging (MRI) system comprising:
    a main field magnet generating a main magnetic field B0; and
    a receiver cage having
        radio frequency (RF) receiver coils including at least one combination of two coils, the two coils of the at least one combination decoupled based on quadrature decoupling such that the two coils of the at least one combination are able to receive signals orthogonal to each other and to B0;
        a substrate for supporting the RF receiver coils;
        wherein the receiver cage is in the shape of a head gear having top, front, right, left and back surfaces, said at least one combination of two coils being supported by the top surface; and
        wherein the at least one combination of two coils includes two butterfly coils, the loop-plane of the butterfly coils arranged along the top surface of the receiver cage substantially orthogonal to B0, the longitudinal axis of the butterfly coils being substantially orthogonal and crossing at substantially midpoint.

2. The MRI system of claim 1 comprising a further combination of two coils wherein a first of the two coils of the further combination is a loop coil and the second of the two coils of the further combination is a butterfly coil, the loop plane of the coils being arranged along a further surface with the loop coil being positioned to have its center align with the center of the butterfly coil.

3. The MRI system of claim 2 wherein the at least one combination of two coils and the further combination of two coils are decoupled using at least one of: capacitive decoupling, inductive decoupling, geometric decoupling and digital decoupling.

4. The MRI system of claim 2 wherein one axis of the further surface is substantially orthogonal to B0.

5. The MRI system of claim 4, wherein the longitudinal axis of the butterfly coil is substantially orthogonal to B0.

6. The MRI system of claim 1 wherein the further surface is curved.

7. A receiver cage for use in a magnetic resonance imaging (MRI) system having a main field B0, comprising:
    radio frequency (RF) receiver coils including at least one combination of two coils, the two coils of the at least one combination decoupled based on quadrature decoupling such that the two coils of the at least one combination are able to receive signals orthogonal to each other and to B0;
    a substrate for supporting the RF receiver coils;
    wherein the receiver cage is in the shape of a head gear having top, front, right, left and back surfaces, said at least one combination of two coils being supported by the top surface; and
    wherein the at least one combination of two coils includes two butterfly coils, the loop-plane of the butterfly coils arranged along the top surface of the receiver cage substantially orthogonal to B0, the longitudinal axis of the butterfly coils being substantially orthogonal and crossing at substantially midpoint.

8. The receiver cage of claim 7 wherein the substrate is one of flexible or rigid.

9. The receiver cage of claim 7 wherein the substrate is rigid.

10. The receiver cage of claim 7 wherein at least one further combination of two coils includes a loop coil and a butterfly coil, the loop plain of the coils being arranged along a surface with the loop coil being positioned to have its center align with the center of the butterfly coil.

11. The receiver cage of claim 7 wherein the head gear is a helmet and the surfaces are curved in accordance with the topology of the corresponding surfaces of a human head.

12. The receiver cage of claim 7 wherein at least some of the RF receiver coils are decoupled using at least one of: capacitive decoupling, inductive decoupling, geometric decoupling and digital decoupling.

\* \* \* \* \*